(12) United States Patent
Webjorn et al.

(10) Patent No.: US 6,511,236 B1
(45) Date of Patent: Jan. 28, 2003

(54) OPTOELECTRONIC ASSEMBLY AND METHOD FOR FABRICATING THE SAME

(75) Inventors: Jonas Webjorn, Sunnyvale, CA (US); Jean-Marc Verdiell, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/390,945

(22) Filed: Sep. 7, 1999

(51) Int. Cl.[7] .................................................. G02B 6/36
(52) U.S. Cl. ............................ 385/91; 385/88; 385/90
(58) Field of Search ............................... 385/88, 90–92

(56) References Cited

U.S. PATENT DOCUMENTS

| | | | |
|---|---|---|---|
| 3,908,184 A | | 9/1975 | Anazawa |
| 4,114,177 A | | 9/1978 | King |
| 4,119,363 A | | 10/1978 | Camlibel et al. |
| 4,233,619 A | | 11/1980 | Webb et al. |
| 4,357,072 A | | 11/1982 | Goodfellow et al. |
| 4,773,727 A | * | 9/1988 | Le Pivert et al. ............ 385/134 |
| 4,893,901 A | | 1/1990 | Taumberger |
| 4,926,545 A | | 5/1990 | Pimpinella et al. |
| 5,119,448 A | | 6/1992 | Schaefer et al. |
| 5,123,074 A | | 6/1992 | Yokota et al. |
| 5,132,532 A | | 7/1992 | Watanabe |
| 5,163,108 A | | 11/1992 | Armiento et al. |
| 5,195,155 A | * | 3/1993 | Shimaoka et al. ............ 385/90 |
| 5,553,180 A | | 9/1996 | Belekiy et al. |
| 5,569,958 A | | 10/1996 | Bloom |
| 5,570,444 A | * | 10/1996 | Janssen et al. ............... 385/90 |
| 5,610,395 A | | 3/1997 | Nishiyama |
| 5,619,609 A | | 4/1997 | Pan et al. |
| 5,641,984 A | | 6/1997 | Aftergut |
| 5,833,202 A | | 11/1998 | Wolfgang |
| 6,207,950 B1 | * | 3/2001 | Verdiell ..................... 250/239 |
| 6,227,724 B1 | * | 5/2001 | Verdiell ..................... 385/91 |

* cited by examiner

Primary Examiner—Hemang Sanghavi
Assistant Examiner—Sarah U Song
(74) Attorney, Agent, or Firm—Blakely, Sokoloff, Taylor & Zafman LLP

(57) ABSTRACT

A package for optical components and a method for making the package are disclosed. The package comprises a quasi-planar substrate having a positioning floor, a platform and an optional ring frame of precisely determined height. Optical components picked and placed on a substrate floor, a raised platform and frame. A flexure assembly allows fine positioning of components requiring critical optical alignment.

11 Claims, 19 Drawing Sheets

OPTOELECTRONIC ASSEMBLY AND METHOD FOR FABRICATING THE SAME

FIELD OF THE INVENTION

The present invention relates generally to optoelectronic assemblies having optical components and methods for making the same; more particularly, the present invention relates to an assembly having optical components mounted on a quasi-planar substrate and a flexure and methods for making the same.

BACKGROUND OF THE INVENTION

Sealed packages are necessary to contain, protect, couple to optical fibers and electrically connect optoelectronic components. Optoelectronics packaging is one of the most difficult and costly operations in optoelectronics manufacturing. Optoelectronic packages provide submicron alignment between optical elements, high-speed electrical connections, excellent heat dissipation, and high reliability. Providing such features has resulted in optoelectronic packages that are larger, costlier and more difficult to manufacture than electronic packages. In addition, current designs of optoelectronic packages and associated fabrication processes are ill adapted for automation because today's high-performance butterfly packages are characterized by a large multiplicity of mechanical parts (submounts, brackets, ferrules, etc.), three-dimensional (3D) alignment requirements, and poor mechanical accessibility.

U.S. Pat. No. 4,953,006 by Kovatz discloses a package for an edge-coupled optoelectronic device. The package includes a cover with a window, so that optoelectronic device, such as, for example, a laser, may be coupled to external optics, such as a lens or an optical fiber. Although this package provides hermeticity and high-speed electrical connections, it does not provide for a way to mount and align collimation or coupling optics nor optical fibers.

U.S. Pat. No. 5,005,178 by Kluitmans and Tjassens and U.S. Pat. No. 5,227,646 by Shigeno also disclose packages for optical and optoelectronic components. Kluitmans et al. discuss a package for a laser diode coupled to an optical fiber. The package includes a conducting rod so that the laser may be used at high speed. Shigeno describes a heat sink for cooling an enclosed laser diode, where the laser diode is preferably coupled to an optical fiber. However, in both of the above patents, it is difficult to align the laser diode with the optical fiber when constructing the package. Both designs use numerous parts in complex three dimensional arrangements and are unsuitable for automated assembly. U.S. Pat. No. 5,628,196 by Farmer discloses a package including a heat sink for a semiconductor laser, but provides no efficient means for coupling the laser to other optics.

The difficulty in alignment is made more problematic where welding is involved in the manufacturing of a package. The result of the welding process causes a shift to occur in the structure being welded. Therefore, even though something is aligned prior to welding, the result of the welding process may cause such shifts to occur. Where micron accuracy is needed, these shifts affect the over all yield. There are no preferred techniques to reduce the shifts.

Embodiments of the present invention overcome the limitations in the prior art.

SUMMARY OF THE INVENTION

An optoelectronic package is described. In one embodiment, the optoelectronic package includes a substrate having a floor, a first optical element coupled to the substrate, a second optical element, and a flexure coupled to the second optical element and the substrate to optically align the second optical with the first optical element. In one embodiment, the flexure has multiple legs coupled to a body using spring regions, wherein the body of the flexure includes two portions joining at an area of the body having a substantially reduced width with respect to the two portions.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
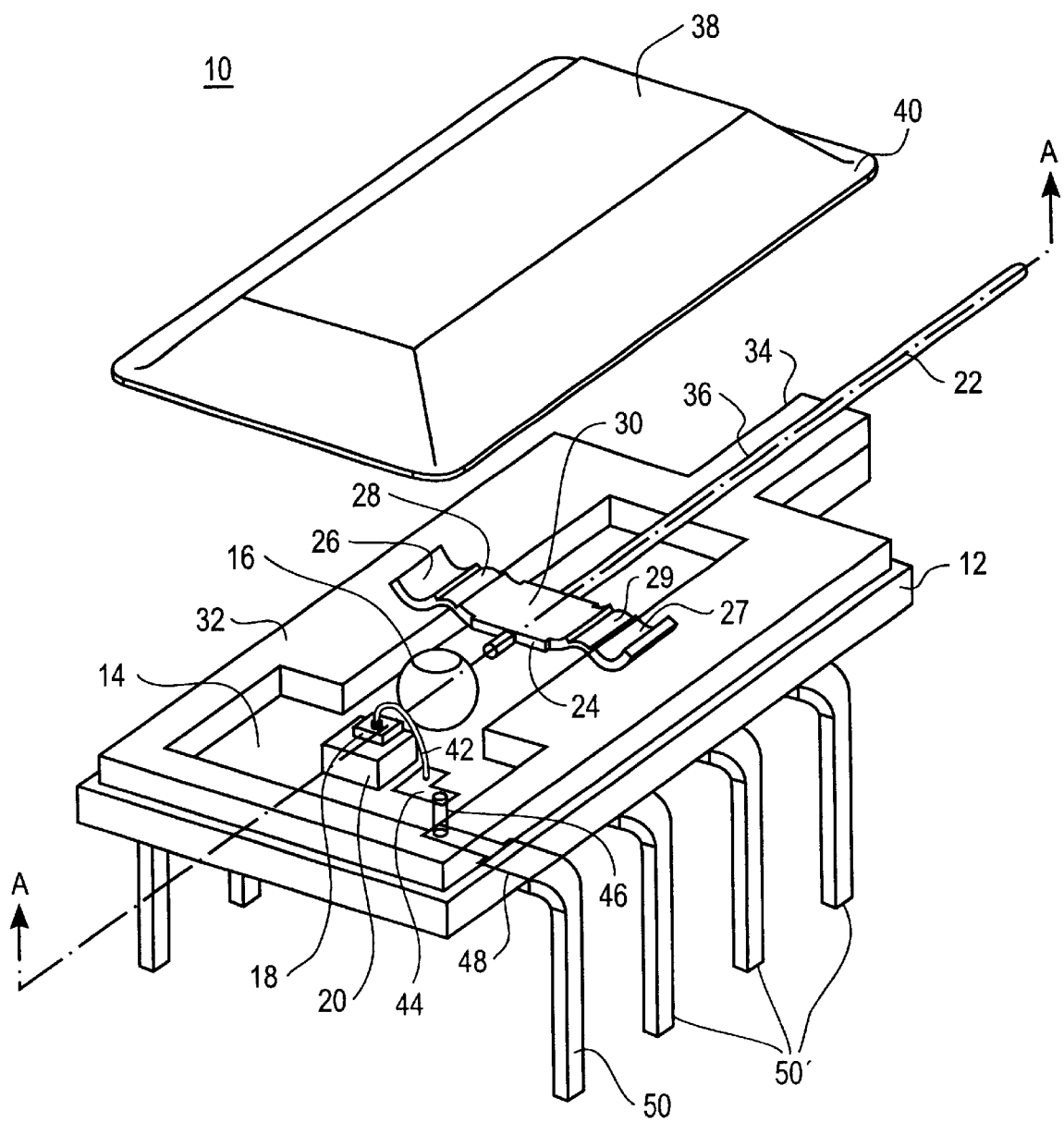
FIG. 1 shows one embodiment of an optoelectronic package assembly.

An optoelectronic assembly is described. In the following description, for purposes of explanation, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

Overview

A package for optoelectronic components and a method for making the package are disclosed. The package uses a flexure coupled to one or more optical components in order to support the component(s), as well as align one or more components in the package. The flexure is typically attached (e.g., welded) to a portion of the interior of the package as part of a pick and place mounting method. Embodiments of the package are advantageous in that the welding used as part of the submicron alignment of optical components is performed with a reduced, or even minimized, weld shift. In one embodiment, the alignment is 3-D adjustable. These features will be discussed. in greater detail below.

In high performance opto-electronic packages, critical optical elements require more precise placement than can be obtained with the combination of platform height control and two-dimensional pick and place. This is the case of single mode fibers, which have to be aligned within less than a micron precision to achieve high optical coupling efficiency. In one embodiment, such components are mounted using a miniature flexure which allows for a small amount of vertical adjustment. In one embodiment, the flexure is made of thin spring steel that may have been etched or stamped, and then bent in a press. The flexure may comprise of two or more legs which rest on the substrate or on each side of the frame. In one embodiment, the legs are joined by a body that supports or clamps the optical element. Two sections of material having a spring property join the legs to the body.

The flexure may be designed so that in its natural (non-flexed) state, the optical axis of the optical component attached to the body rests slightly above the optical plane of the package. Final adjustment of the height is obtained by applying pressure to the flexure, therefore lowering the body height. Dragging the flexure in the plane parallel to the plane of the substrate may be performed to correct the lateral position. When adequate alignment is reached, the legs are permanently attached to the frame or substrate. The attachment may be by, for example, laser welding, soldering or adhesive bonding. In another refinement of the flexure design, the flexure has more than two legs. The first pair of legs is attached to the frame after coarse optical alignment. The flexure is then finely realigned, using the residual flexibility left after the two first legs are attached. When the optimum position is reached, the remaining legs are attached.

Thus, at least one embodiment of the present invention provides a package for optical components such that the components are easily and precisely aligned within a package. Such a package may be manufactured inexpensively and in an automatable method.

Embodiments of the optical package may have advantages in that it may be mass-produced at a low cost while maintaining a precision alignment of the optical components within the package.

FIG. 1 shows one embodiment of an optoelectronic assembly 10 with frame 32 and flexure 24. Assembly 10 also includes a substrate 12 with positioning floor 14, which may be substantially planar and the substrate 12 comprises an electronically isolating region with a low coefficient of thermal expansion. In one embodiment, a raised platform is created on positioning floor 14.

In one embodiment, the package comprises a substrate having a positioning floor which provides a mounting surface and the package bottom wall. In one embodiment, the substrate and its positioning floor are substantially planar. In one embodiment, one or more raised platforms are also provided on the mounting surface. The raised platforms may be submounts made of a high thermal conductivity material, such as, for example, copper tungsten, Aluminum Nitride, Berillyum Oxide, Diamond, and Boron Nitride, attached to the floor of the substrate. The raised platforms may be attached, for example, by soldering or brazing, or may even be part of the substrate material itself.

Optical elements, or components, are mounted on positioning floor 14 and platform 20. In one embodiment, a lens 16 is mounted on substrate 12, and an edge emitting optoelectronic element 18, such as, for example, a laser diode, is mounted on platform 20. Other optical components may be used.

An optical element 22 is attached to on flexure 24, by, for example, soldering, brazing or welding. In one embodiment, flexure 24 comprises two legs 26 and 27, a body 30, and two spring regions 28 and 29 at the junction of legs 26 and 27 and body 30. In one embodiment, element 22 is a single mode optical fiber, but it may be any element that requires optical alignment with other optical elements.

A frame 32 may be attached to substrate 12. The ends of legs 26 and 27 are attached to frame 32. Flexure 24 and its attachment method will be discussed in more detail below. In one embodiment, frame 32 has a protruding arm 34 having a groove 36. Groove 36 permits the hermetic passage of the fiber 22 to the outside of the package.

A cap 38 is attached to frame 32, thereby creating an airtight seal. In one embodiment, cap 38 has a top hat shape and a peripheral lip 40 that can be hermetically sealed to the outside portion of frame 32 and on top of groove 36 and fiber 22. The hermetic seal may be created by a process such as seam welding, soldering or adhesive bonding.

In one embodiment, wire bond 42 connects active optical element 18 to electrically conductive pattern 44 which is on the top side of positioning floor 14. Filled conductive via 46 hermetically connects pattern 44 to electrically conductive pattern 48 on the bottom side of positioning floor 14. Pins 50 on the bottom side of positioning floor 14 are also provided for connections to electronic component inside the package through other vias (not shown). The combination of patterns 48 and 44 and filled via 46 provide an efficient and low-parasitic mechanism for hermetically distributing electrical signals from optoelectronic elements inside the hermetic enclosure to pins 50 at the periphery of package 10. Alternatively, signals can be distributed to ball grid array underneath the package for surface mounting.

FIGS. 2A–C, 3A–C, 4A and 4B illustrate a flexure alignment device and alignment method. In one embodiment, flexure 24 comprises a body 30 and two legs 26 and 27. Two spring regions 28 and 29 connect legs 26 and 27 to body 30. The extremities of legs 26 and 27 rest on frame 32. In an alternative design, the extremities of the legs rest directly onto substrate 12. Body 30 holds an optical element 22. In one embodiment, the optical element 22 comprises an optical fiber. In one embodiment, flexure 24 is preferably made from a flat stamped or etched piece of spring steel. Spring regions 28 and 29 can be created by chemically removing half of the metal thickness. Flexure 24, which is substantially flat, is then subsequently formed in a press to shape legs 26 and 27 and spring regions 28 and 29, then annealed at high temperature to confer spring properties to the material. In an alternative embodiment, the material already has spring properties so no annealing is necessary. In one embodiment, flexure 24 is about 170 microns thick, and spring regions 28 and 29 are approximately 85 microns thick. It will be clear from the following how legs 26 and 27, body 30 and spring regions 28 and 29 are designed to allow for precise three-dimensional alignment of optical element 22.

Figure 2A:
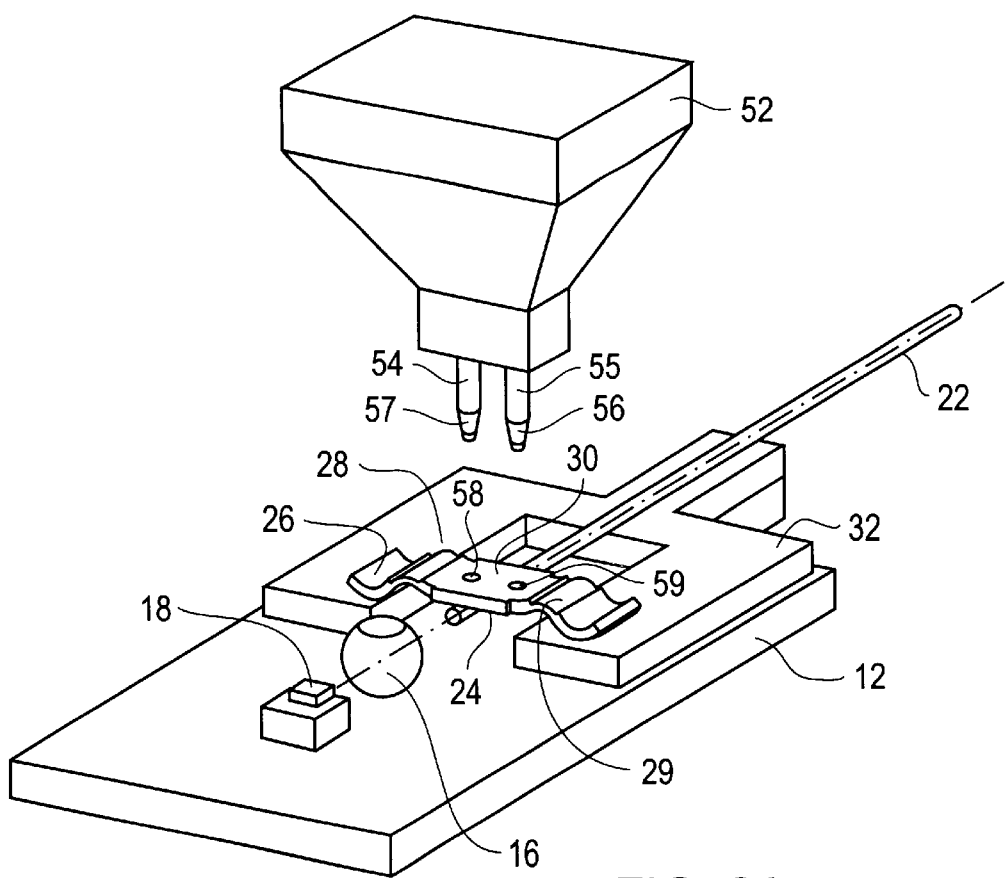
FIG. 2A shows a perspective view of the assembly before alignment of the flexure with a removable positioning tool.
Figure 2B:
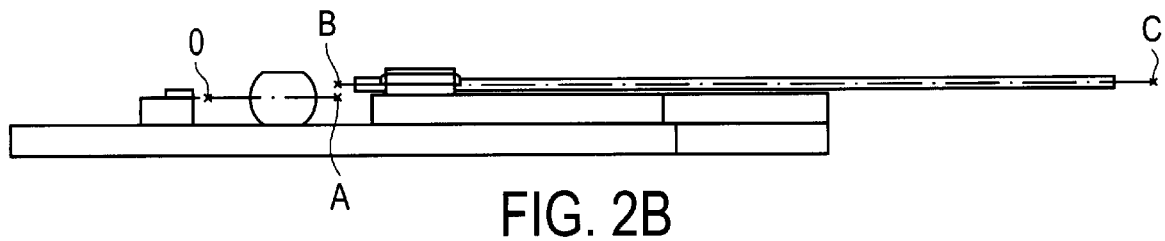
FIG. 2B shows a side view of the assembly before alignment of the flexure.
Figure 2C:
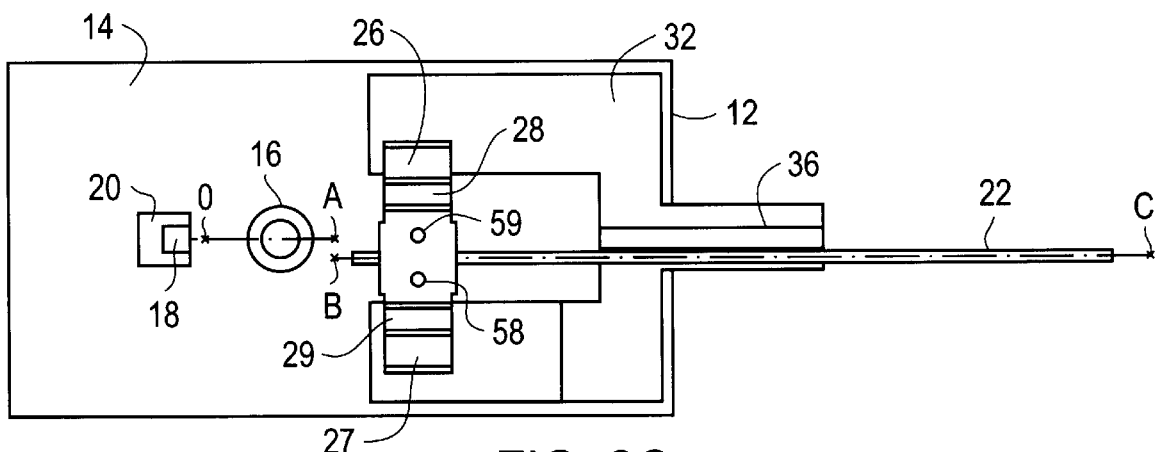
FIG. 2C shows a top view of the assembly before alignment of the flexure.
Figure 3A:
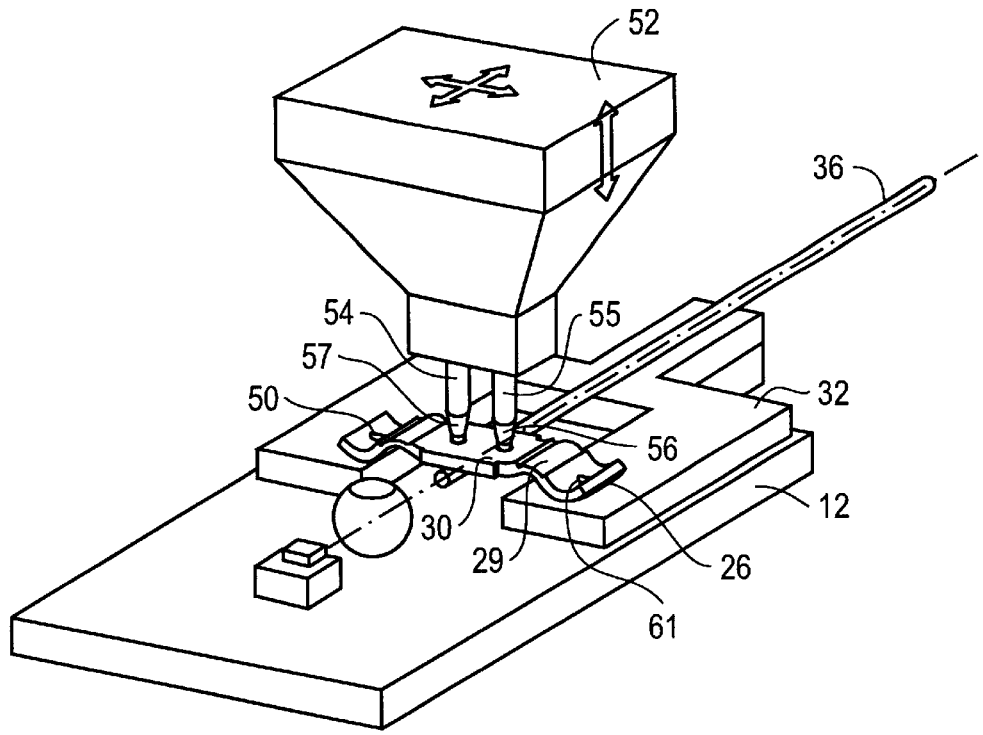
FIG. 3A shows a perspective view of the assembly with the flexure being aligned using the removable positioning tool.
Figure 3B:
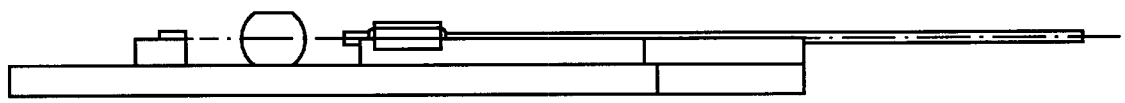
FIG. 3B shows a side view of the assembly after alignment and final attach of the flexure legs.
Figure 3C:
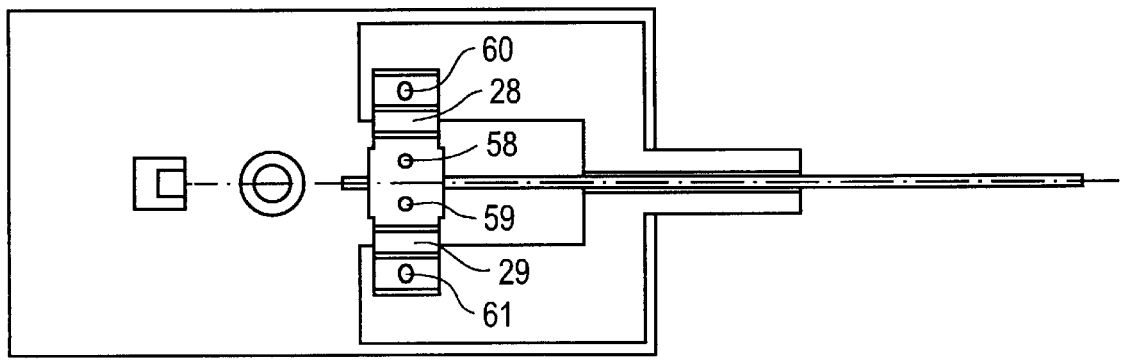
FIG. 3C shows a top view of the assembly after alignment and attach of the flexure legs.

The process begins by first attaching optical element 22 to body 30 of flexure 24 by a process such as, for instance, soldering or adhesive bonding. Flexure 24 and its attached optical element are then picked and dropped in rough alignment on optical assembly 10 as shown in FIG. 2A. At this point, flexure 24 simply rests on frame 32 (or on substrate 12, in a ring-less embodiment), with no further attachment method. At least one first optical element 16 is already attached on optical assembly 10 and defines an optical axis OA, with respect to which optical element 22 and its optical axis BC will be aligned using flexure 24. In one embodiment, a laser diode 18 and a lens 16 are attached on the optical assembly before flexure 24 is aligned. In one embodiment, flexure 24 is designed such that optical axis BC is higher than optical axis OA, as shown in the side view of assembly 10 on FIG. 2B. In one embodiment, BC is about 100 to 200 microns higher than OA when no pressure is applied on flexure 24. The top view of the assembly in FIG. 2C shows that the axis OA and BC may also be offset from each other in the horizontal plane alignment of flexure 24.

Figure 4A:
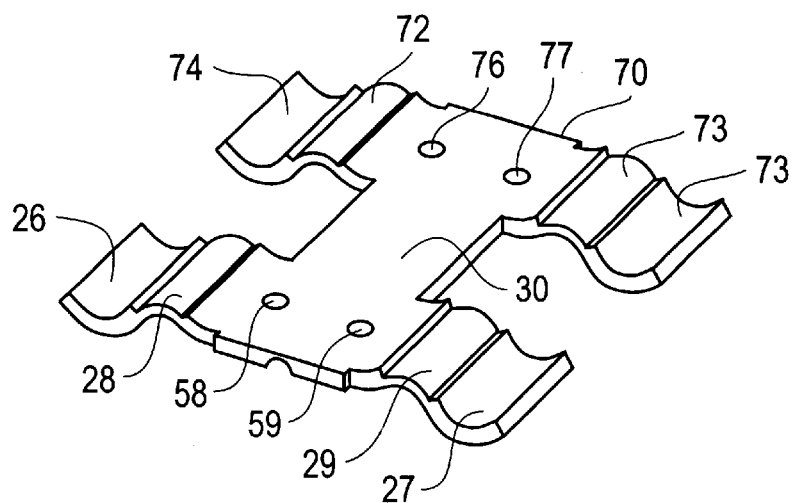
FIG. 4A illustrates one embodiment of a 4 legged flexure.

Removable alignment tool 52 is used to apply pressure to the top of body 30. Tool 52 also features pins 55 and 54 with conical ends 56 and 57 which fit into matching gripping holes 58 and 59 on body 30. It should be clear that the shape of the alignment tool in FIGS. 4A and 5B is just given as an example. Other tools that provide the ability to temporarily clamp onto the flexure and apply pressure on body 30 can be designed by one skilled in the art. For example, matching sets of grooves in the flexure and tool can replace the pin and hole interlocking design. A vacuum tool can also be used.

During the fine alignment step, tool 52 is lowered onto body 30. Conical tips 56 and 57 are tightly fitted in holes 58 and 59. The tool applies pressure on body 30, causing spring regions 28 and 29 to bend under the pressure. This, in turn, causes legs 26 and 27 to spread apart and axis BC to lower into alignment to axis OA, as shown on FIG. 3B. Tool 52 is also moved in a plane parallel to the plane of mounting floor 14, dragging flexure 24 and legs 26 along with it until horizontal and longitudinal alignment of axis OA and BC is obtained, as can be see in the top view of FIG. 3C. In one embodiment, alignment is monitored by measuring coupled power at the output of the fiber while laser 18 is powered up and flexure 24 undergoes fine alignment. Once desired alignment is obtained, the leg extremities are attached to the ring frame 32 or substrate 12. One attachment process is laser microwelding through laser beam 62, which creates welding spots 60 and 61. Welding spots permanently attach metallic legs 26 to metallic ring frame 32. Other attachment processes may also be used, such as UV curable adhesives, epoxies, or soldering. After final attachment of the legs is complete, tool 52 is raised from the assembly, leaving the aligned assembly shown in FIGS. 3B and 3C.

Most attachment processes induce minute, undesirable shift or drift during the attachment operation. In the case of adhesives, shift is typically caused by the shrinkage of the adhesive; in the case of soldering, shift is caused by the change of solder volume during the solidification phase and by the expansion and contraction of parts during the temperature cycle; in laser welding, a post-weld shift is usually observed.

Figure 4B:
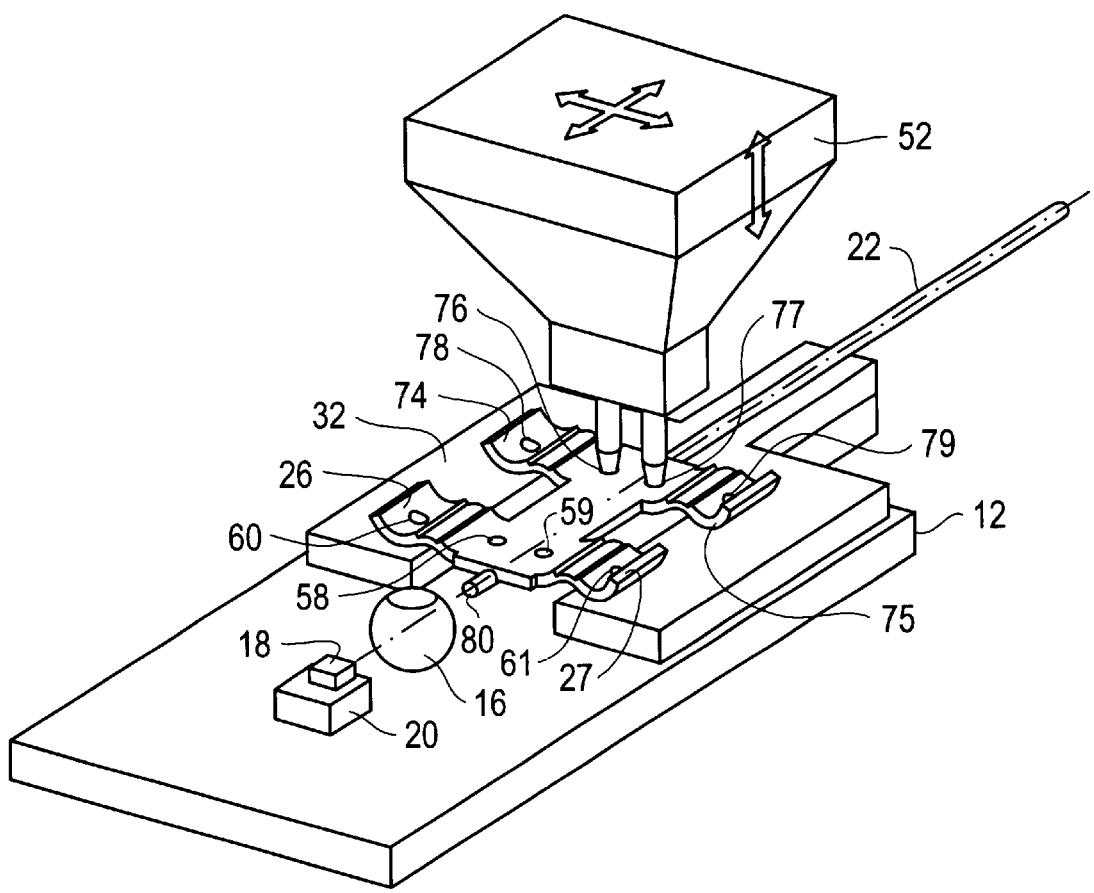
FIG. 4B shows the fine alignment step using the back legs of a 4 legged flexure.

FIG. 4A shows one flexure embodiment that. reduces, or even minimizes, the effect of such shifts and allows greater alignment precision and reproducibility. Flexure 70 of FIG. 4A comprises two pairs of legs, a front pair of legs 26 and 27 and a rear pair of legs 74 and 75. The front pair of legs is located close to optical element 16 as shown in FIG. 4B, and is aligned using tool 52 and gripping holes 58 and 59 and following the previously described method. Front legs 26 and 27 are permanently attached to frame 32 as previously described, using for example laser welding spots 60 and 61. Post-attachment shift is corrected in a second alignment step by using tool 52 and rear gripping holes 76 and 77 located in proximity of the rear pair of legs 74 and 75. The residual flexibility of flexure 70 allows a small positioning correction of tip 80 of optical element 22 by moving rear of flexure 70 with tool 52. After second alignment, rear legs are attached to frame 32 by laser welding spots 78 and 79. Alignment tool 52 is then lifted from assembly. As discussed in more detail below, there are other ways to accommodate the welding process.

Alternative Flexure Embodiments

Figure 5:
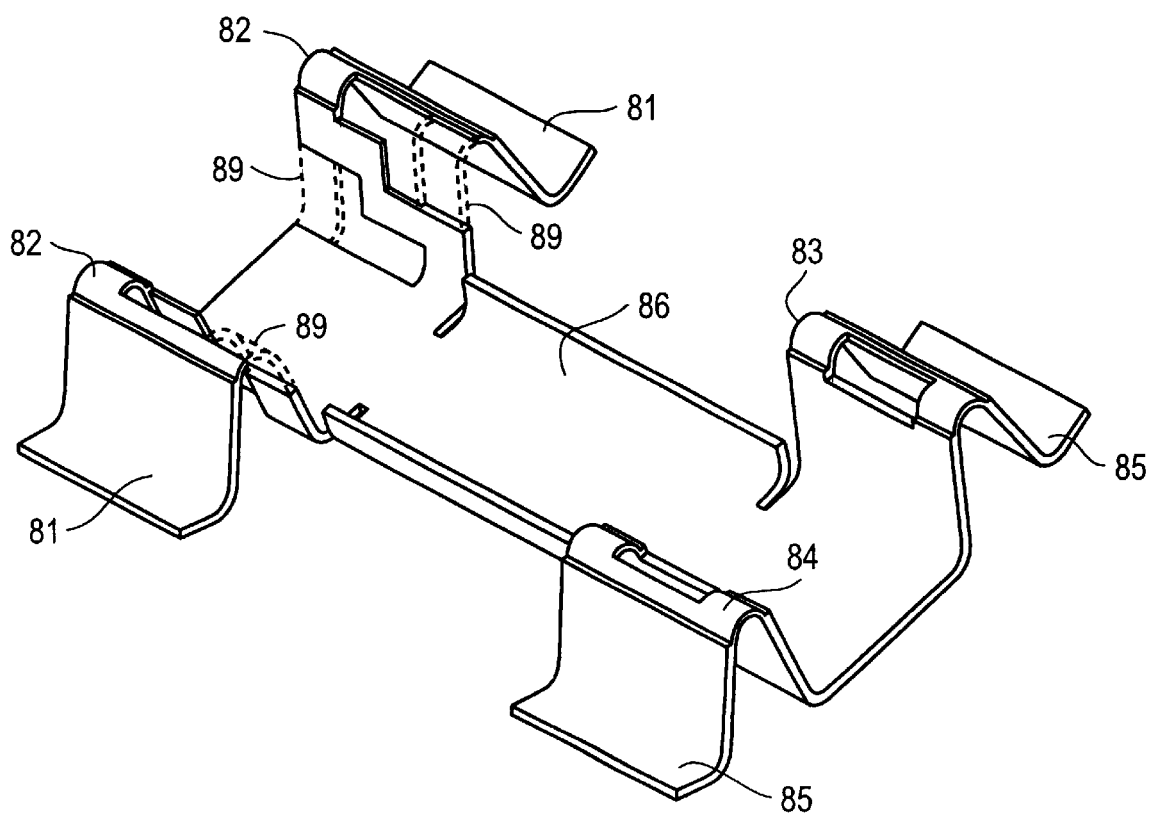
FIG. 5 shows an alternate embodiment of a flexure.

FIG. 5 illustrates an alternate embodiment of a flexure in FIG. 4A. Referring to FIG. 5, the flexure includes a body 86 and two pairs of legs, in which the spring portions 82 for connecting the two front legs have been reduced. In FIG. 5, body spring portions 82 coupling their associated front legs 81 to the body 86 are smaller in total area than the spring portions 83 and 84 coupling the back legs 85 to body 86. This provides and additional freedom of movement to body 86 after the front legs have been connected (e.g., welded). This additional freedom of movement may be used to align an optical fiber (or other component) coupled to the flexure after welding the front set of legs, yet before welding the back set of legs, such as is described above. This freedom is achieved by removing portions 89 of the flexure. This removal may occur after legs 81 have been attached in the package.

Figure 6:
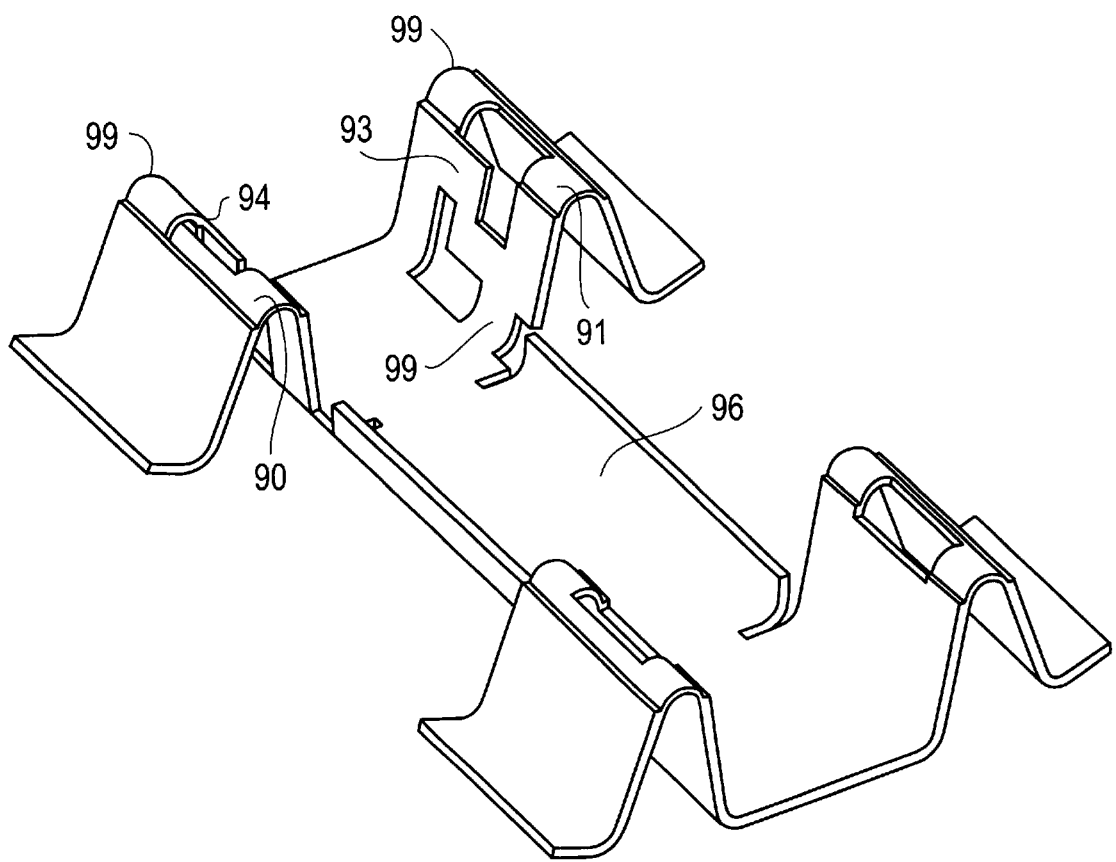
FIG. 6 shows an alternate embodiment of a flexure.
Figure 9:
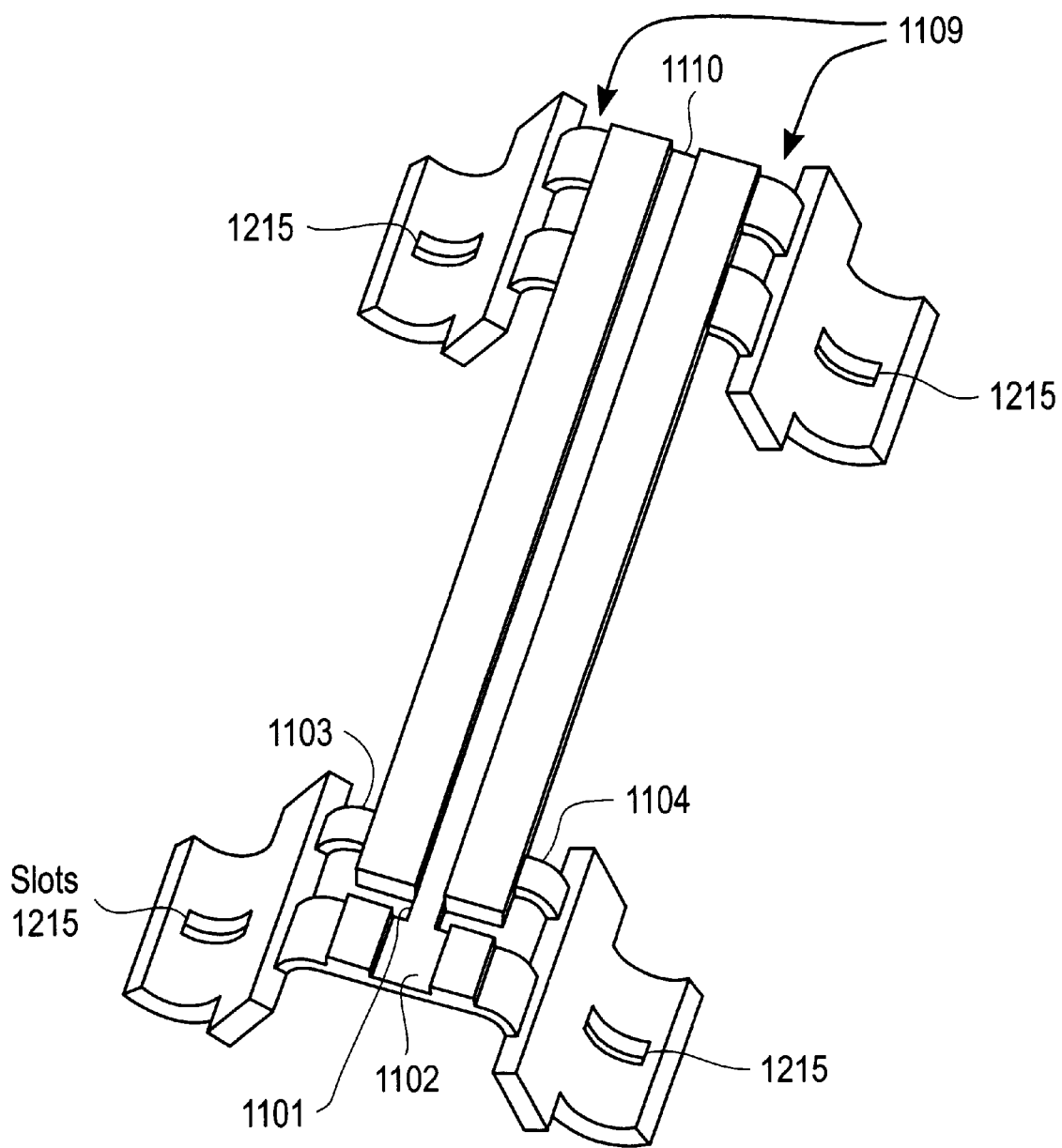
FIG. 9 shows an alternate embodiment of a flexure.

FIG. 6 is an alternative embodiment of the flexure. Referring to FIG. 9, the flexure includes a body 96 and two pairs of legs, where the spring portions 90 and 91 connecting the two front feet to the flexure body are reduced from that embodiment shown in FIG. 4A. However, the shape of portions 93 and 94 gives a larger mechanical path between body 86 and the front feet and thus greater mechanical flexibility.

Figure 7:
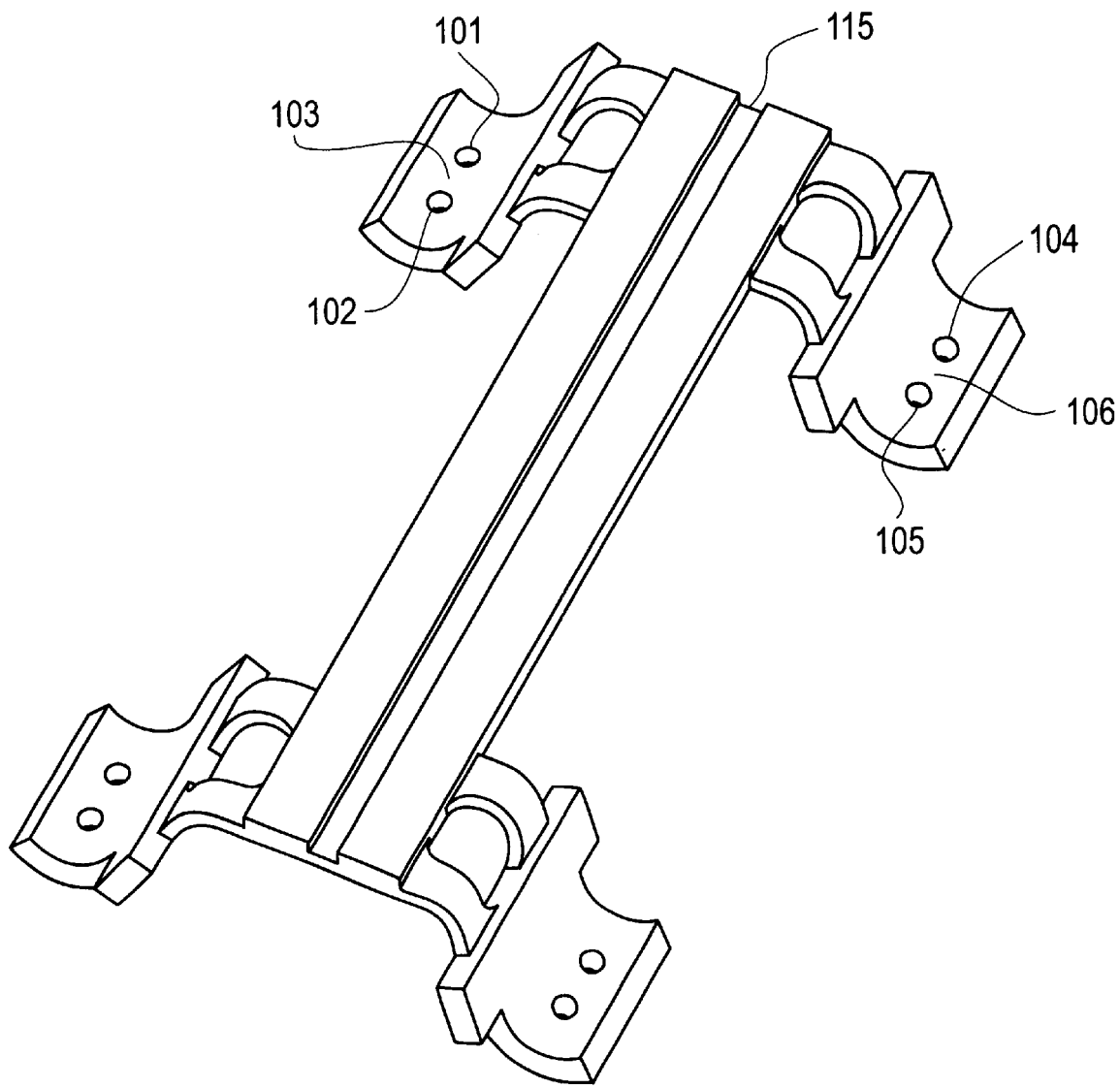
FIG. 7 shows an alternate embodiment of a flexure.

FIG. 7 illustrates an alternative embodiment of the flexure in FIG. 4A in which each of the feet (or some portion of the total number of feet) have a pair of holes between which a spot weld is made using a laser pulse to connect the flexure to the substrate. Referring to FIG. 7, one of the back legs is shown having holes 101 and 102. At location 103 between holes 101 and 102, a spot weld is made to secure the foot of the flexure to the substrate. Similarly, holes 104 and 105 are shown with a spot weld location 106 between the two. Note that the flexure in FIG. 7 also includes a groove 115 for placement of the fiber.

Figure 8:
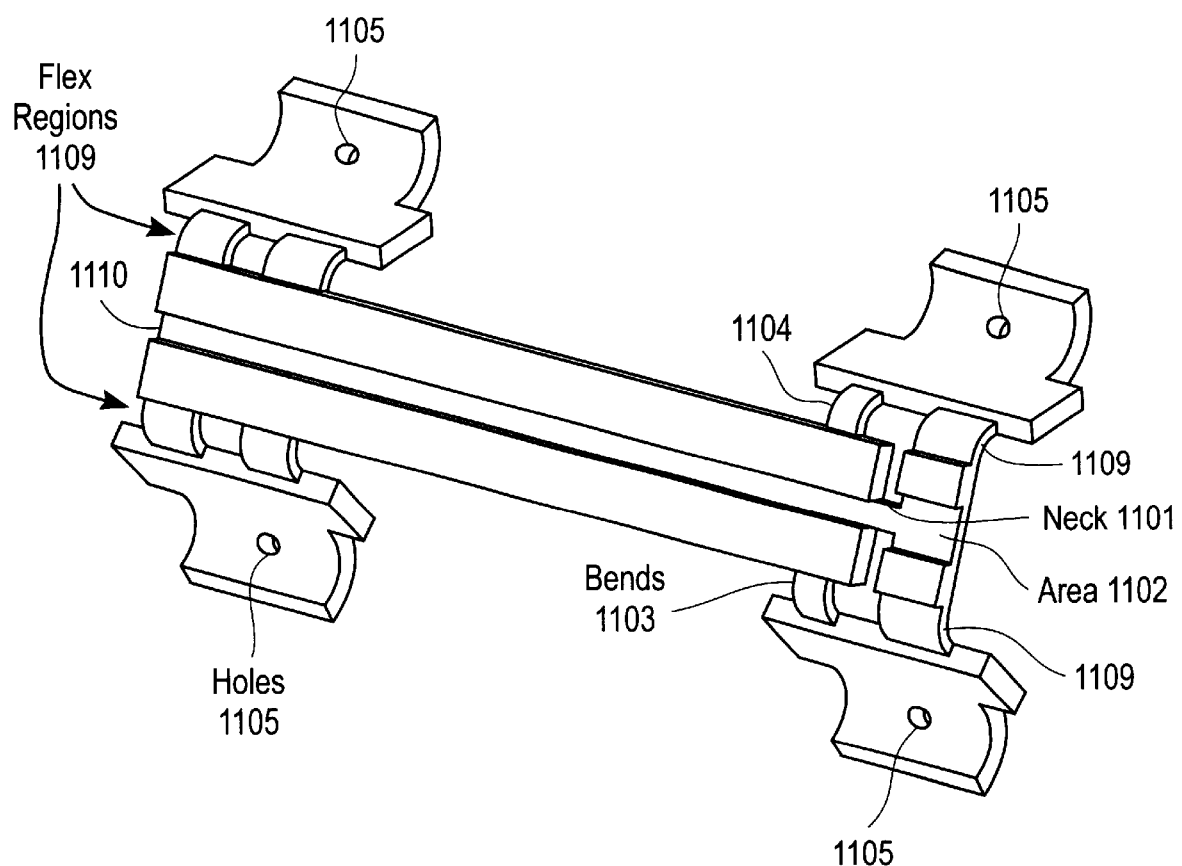
FIG. 8 shows an alternate embodiment of a flexure.

FIG. 8 illustrates an alternative embodiment to the flexure shown in FIG. 7. Referring to FIG. 8, the flexure includes holes 1105 that are used as the locations for spot welding or other connection to the substrate. Similar to FIG. 7, FIG. 8 has spring portions 1109 that allow the body of the flexure to move up and down (i.e., move towards and away from the substrate). The flexure also includes extraction, or removal, regions 1103 and 1104 that are removed after the front feet of the flexure have been attached, yet prior to the back feet being welded. This is advantageous in that once removal regions 1103 and 1104 are removed, the body of the flexure may pivot about neck region 1101 with the fiber being moved in area 1102 in order to obtain better alignment of the optical fiber (or component) coupled to the flexure. Thus, the body of the flexure has portions which are joined at neck region 1101 which is much smaller in size that the portions its connecting (when viewed from a top view).

In one embodiment, when fabricating the optoelectronic assembly and connecting the flexure to the substrate, the fabrication process includes a series of steps which begin with mounting the front feet to the substrate, then removing removal regions 1103 and 1104. After removing removal regions 1103 and 104, the fiber (which is already coupled to groove region 1110) or other component is aligned by moving the flexure body so that it pivots at neck region 1101 and is free to move with respect to area 1102. Once alignment has been achieved, the rear feet of the flexure are connected. to the substrate.

FIG. 9 illustrates a variation of the flexure embodiment in FIG. 8. Referring to FIG. 9, the welding area to connect the flexure to the substrate is in the form of slots 1215 instead of holes 1105. The slots provide the benefit of a longer surface area for connection. For example, after the flexure has been located onto the substrate and is pressed toward the substrate in order to obtain optical alignment of the optical components, the legs spread out. Because the legs are spread farther apart, there is a greater likelihood that a portion of the slot (because of its length) will remain in contact with the substrate as opposed to having a circular hole as the connection point. When the feet only have use of a circular hole as a contact point, it is possible that after the flexure has been pressed towards the substrate, the hole may not be in direct contact with the substrate any longer, which makes a welding process more difficult.

Figure 10:
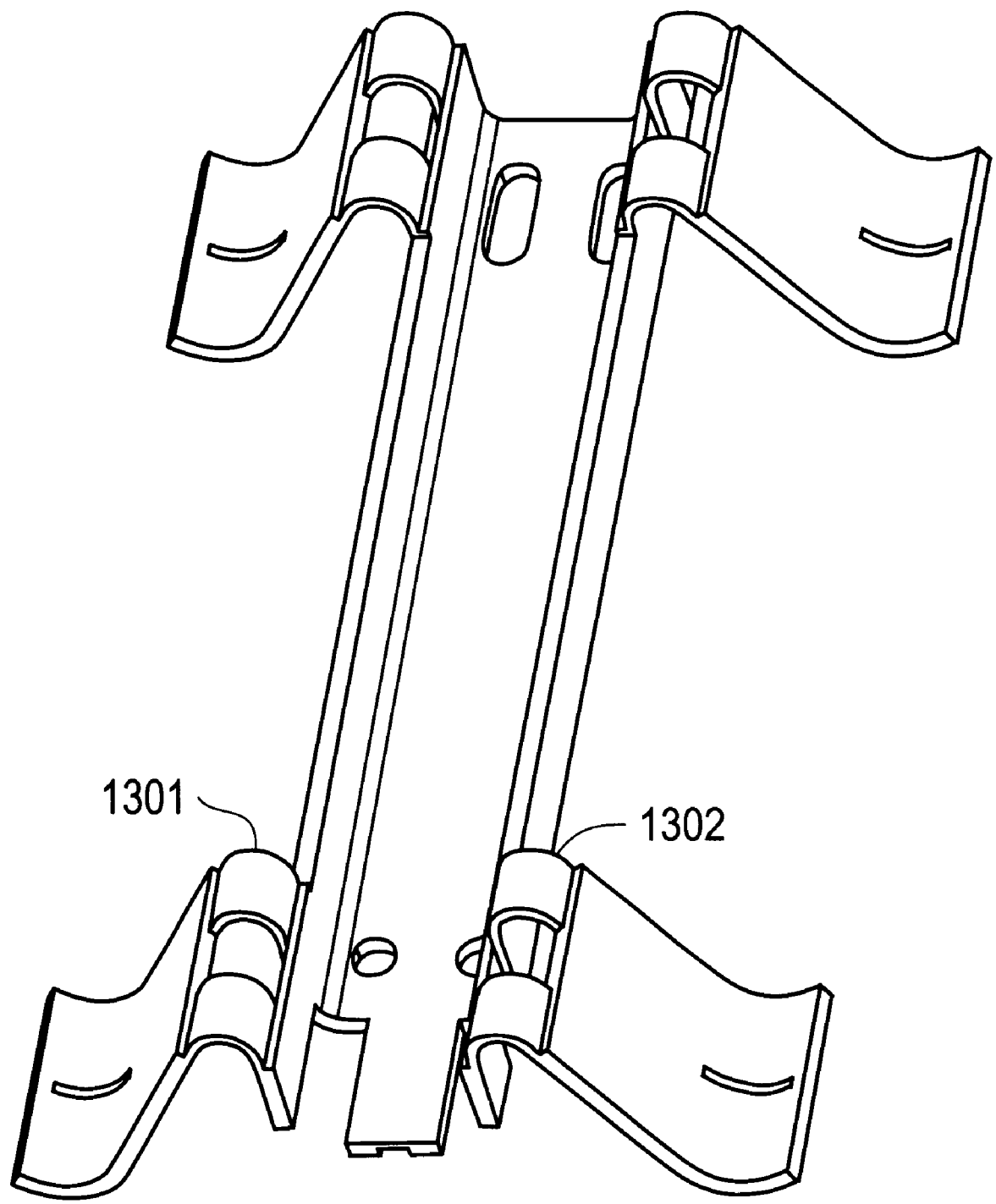
FIG. 10 shows an alternate embodiment of a flexure.

FIG. 10 illustrates an alternative embodiment to the flexure in FIG. 8. Referring to FIG. 10, the flexure includes removal regions 1301 and 1302 which are removed after the front-feet are attached to the substrate and prior to the connection of the back feet to facilitate alignment of the fiber coupled to the flexure body. Note that the optical component (e.g., fiber) coupled to the flexure body is mounted (e.g., soldered, glued, etc.) on the underside portion of the flexure facing the substrate.

Figure 11:
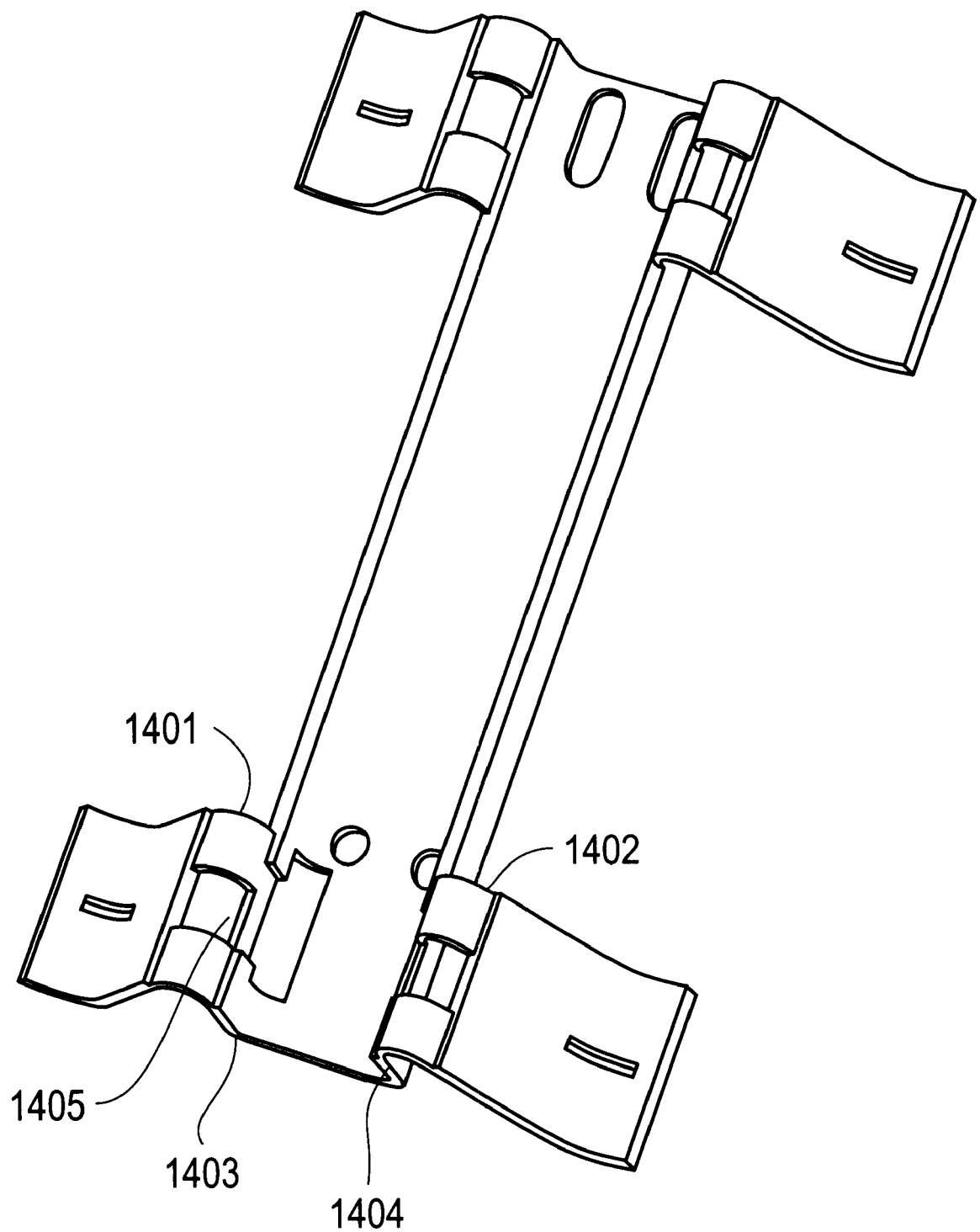
FIG. 11 shows an alternate embodiment of a flexure.

FIG. 11 illustrates an alternative embodiment of the flexure in which two regions of the flexure on each of the front two legs are removed after the flexure has been connected to the substrate to facilitate movement of the flexure prior to securing the back legs. Referring to FIG. 11, sections 1401, 1402, 1403 and 1404 are removed after the front legs have been secured to the substrate so that a region, such as region 1405, connects one of the feet to the flexure body. This removal gives us the flexures similar to the that shown in FIGS. 8 and 9. The flexure also includes slots on the feet that provide more flexibility. Note that the optical component (e.g., fiber) coupled to the flexure body is mounted (e.g., soldered, glued, etc.) on the underside portion of the flexure facing the substrate.

Figure 12:
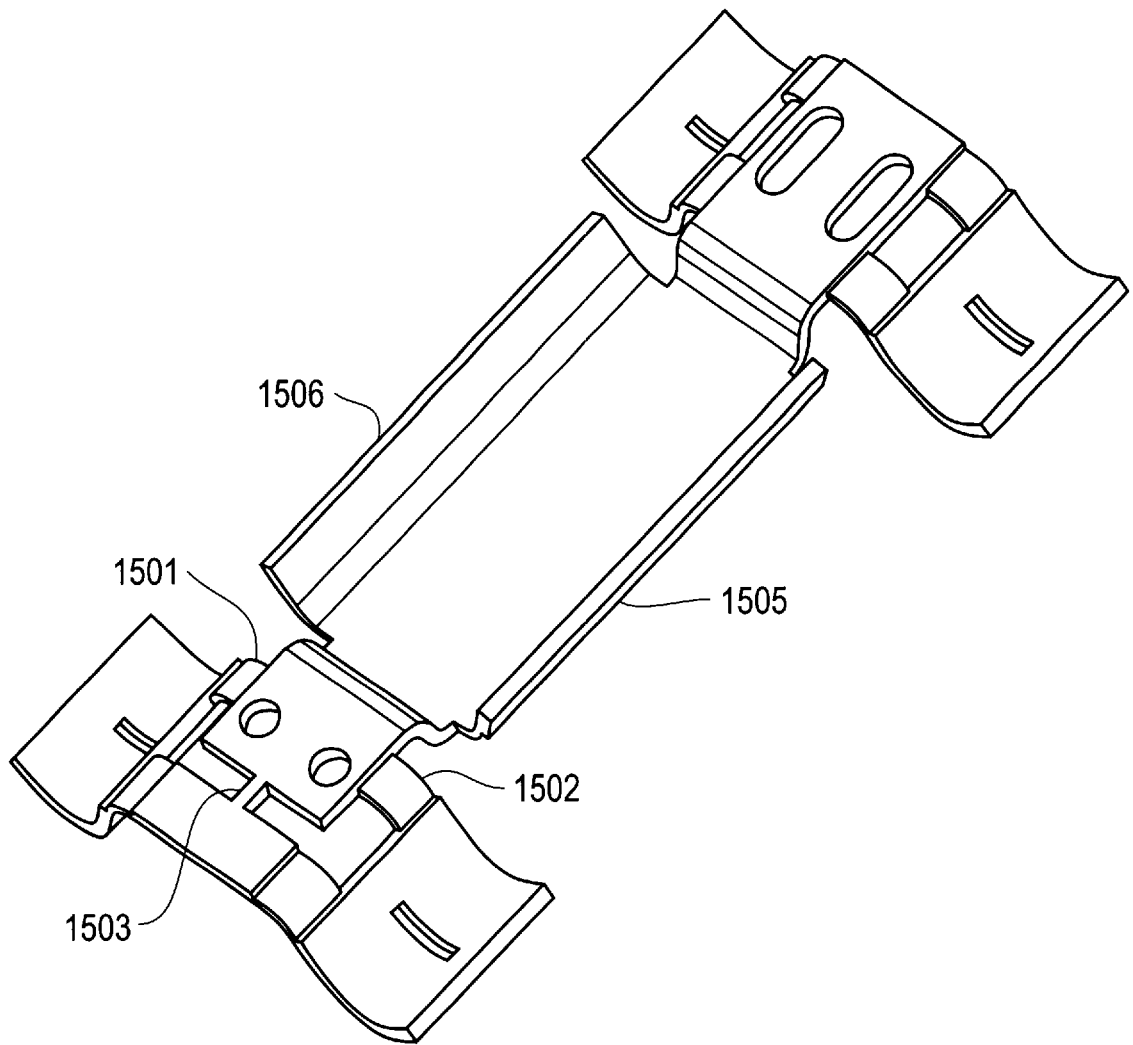
FIG. 12 shows an alternate embodiment of a flexure.

FIG. 12 illustrates still another embodiment of a flexure in which regions 1501 and 1502 are removed after securing the front feet of the flexure which are coupled to regions 1501 and 1502, thereby allowing neck region 1503 to act as a pivot when aligning the fiber. The flexure also includes side areas 1505 and 1506 that add rigidity to the body. Note that the optical component (e.g., fiber) coupled to the flexure body is mounted (e.g., soldered, glued, etc.) on the underscale portion of the flexure facing the substrate.

Figure 13:
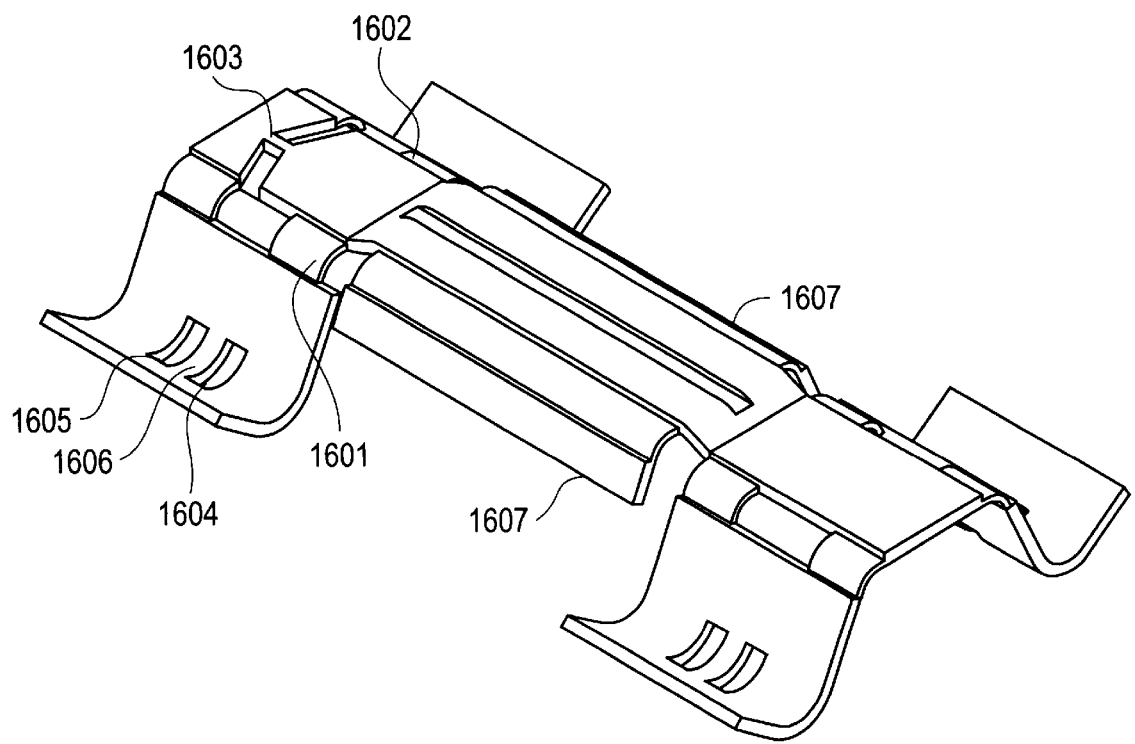
FIG. 13 shows an alternate embodiment of a flexure.

FIG. 13 illustrates another alternate embodiment of the flexure in which regions 1601 and 1602 coupling, in part, the front feet to the flexure body are removed after securing the front feet to the substrate, allowing the rear portions of the flexure to move around neck region 1603 when aligning the fiber. Each of the feet have a pair of slots. Securing the feet of the flexure embodiment is performed by welding in an area of the flexure, such as 1606 between slots 1605 and 1604 on each of the feet. Rigid regions 1607 add support to the flexure.

Figure 14:
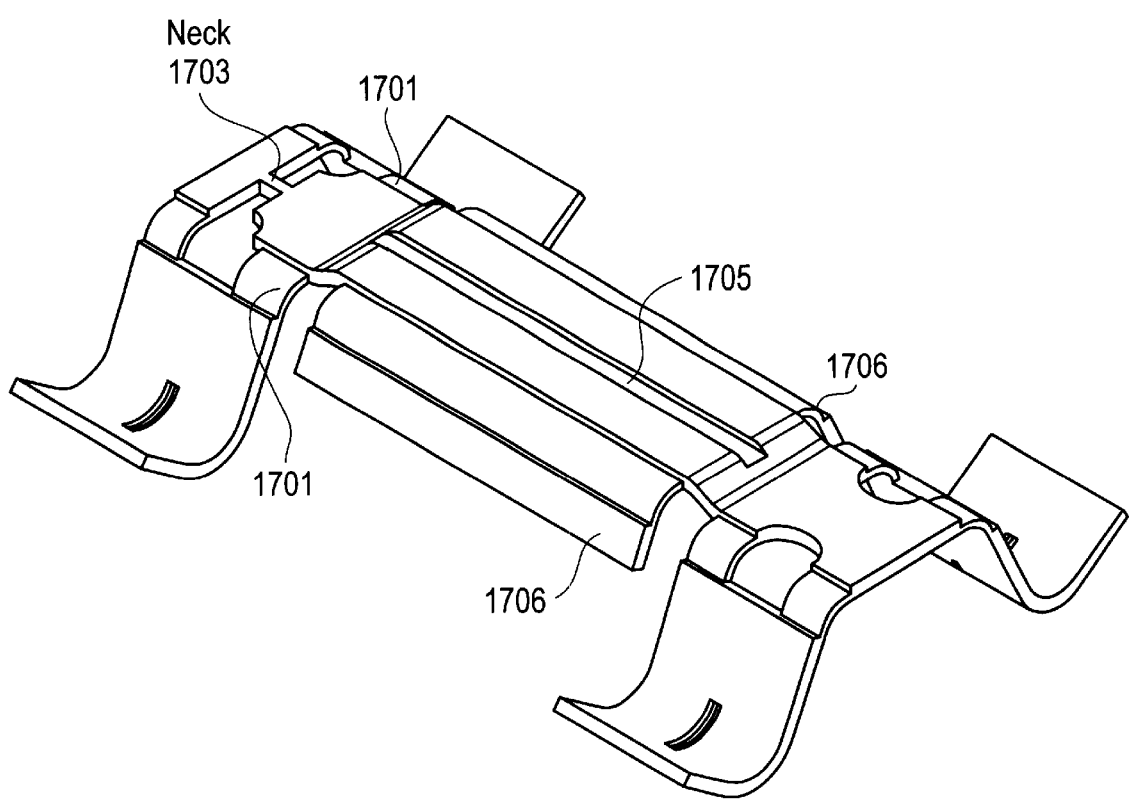
FIG. 14 shows an alternate embodiment of a flexure.

FIG. 14 illustrates an alternative embodiment of the flexure. The flexure includes side areas, rigidizer 1706, on the body for added stiffness and rigidity. Again, the flexure of FIG. 14 includes removable areas 1701 and a neck region 1703 to allow aligning of the fiber which sits in and is coupled to groove 1705 during the fabrication process.

Figure 15:
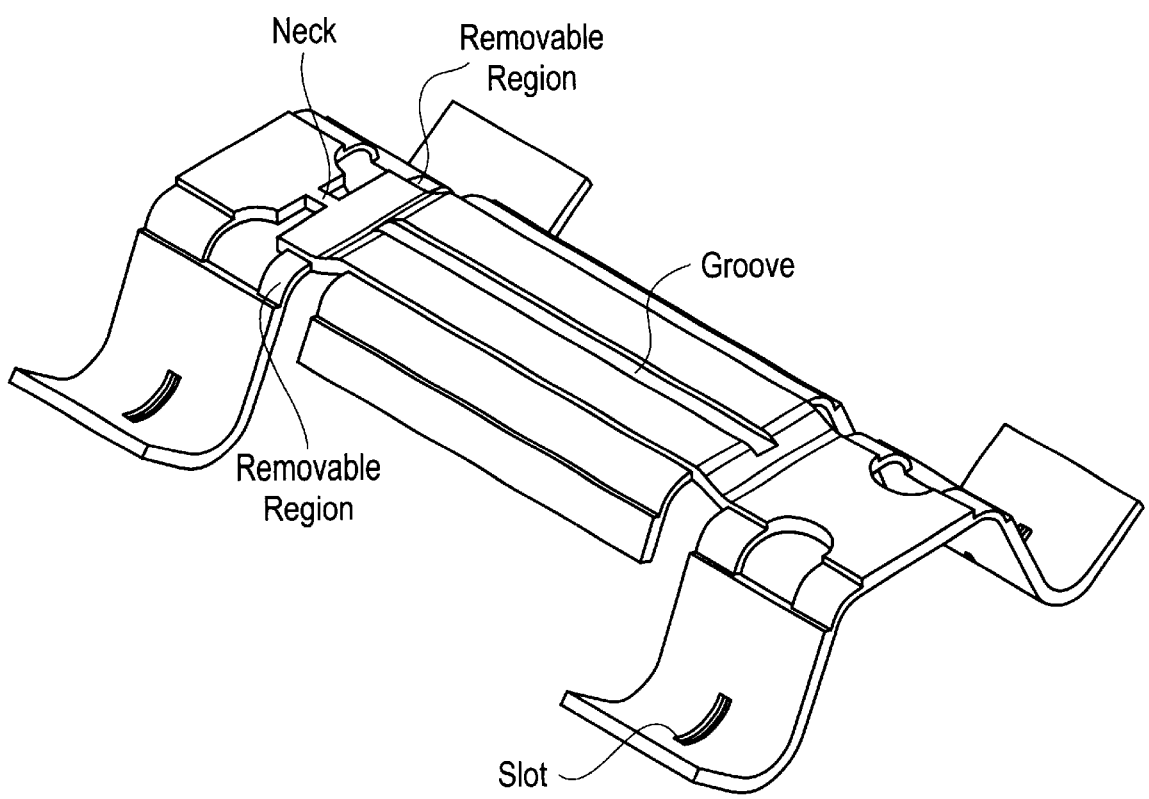
FIG. 15 shows an alternate embodiment of a flexure.

FIG. 15 illustrates another embodiment of a flexure. The significance of the difference in the neck region of this flexure and the one in FIG. 14 is that there are different distances between pivot joint and fiber tip.

Figure 16:
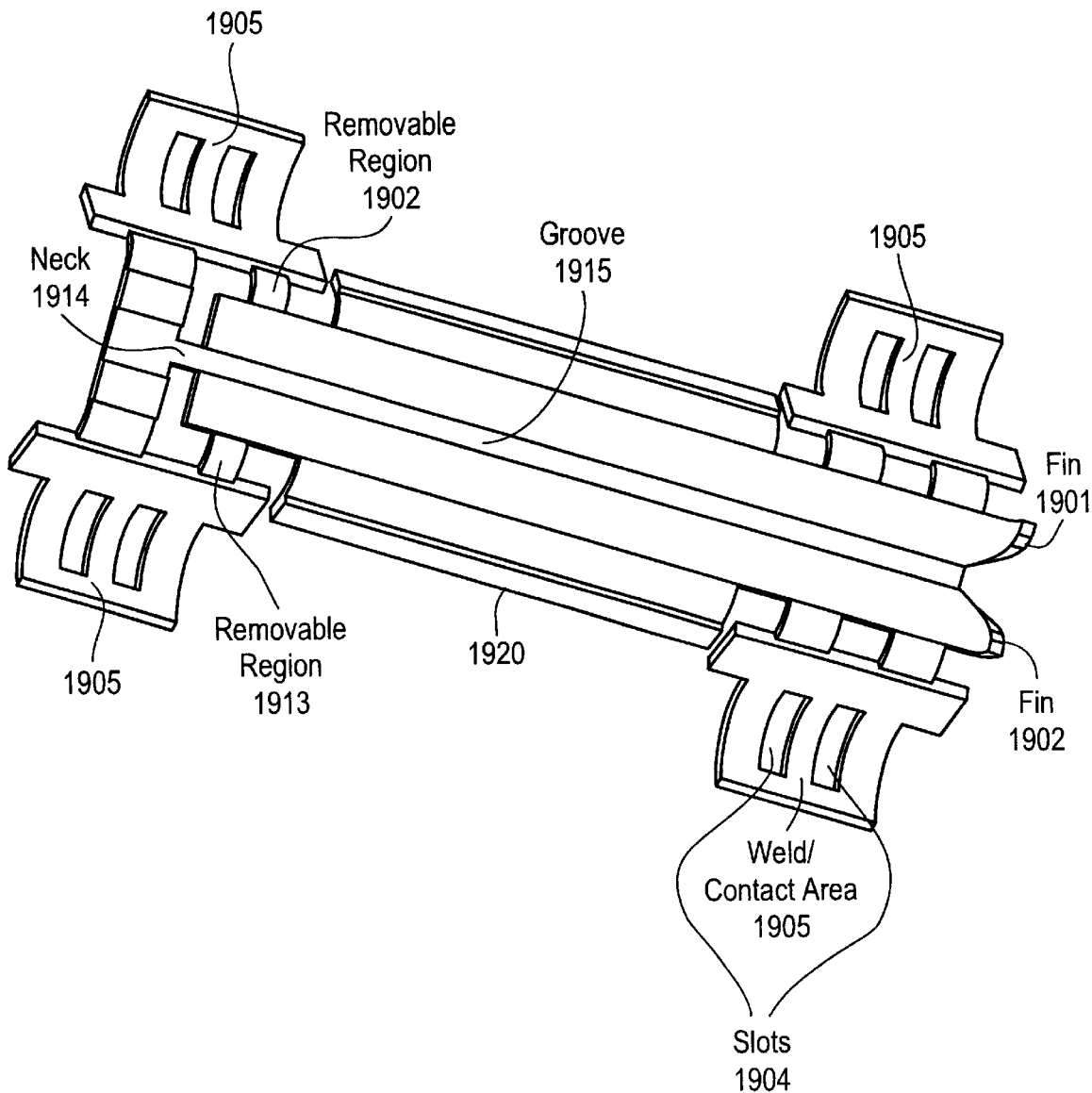
FIG. 16 shows an alternate embodiment of a flexure.
Figure 17:
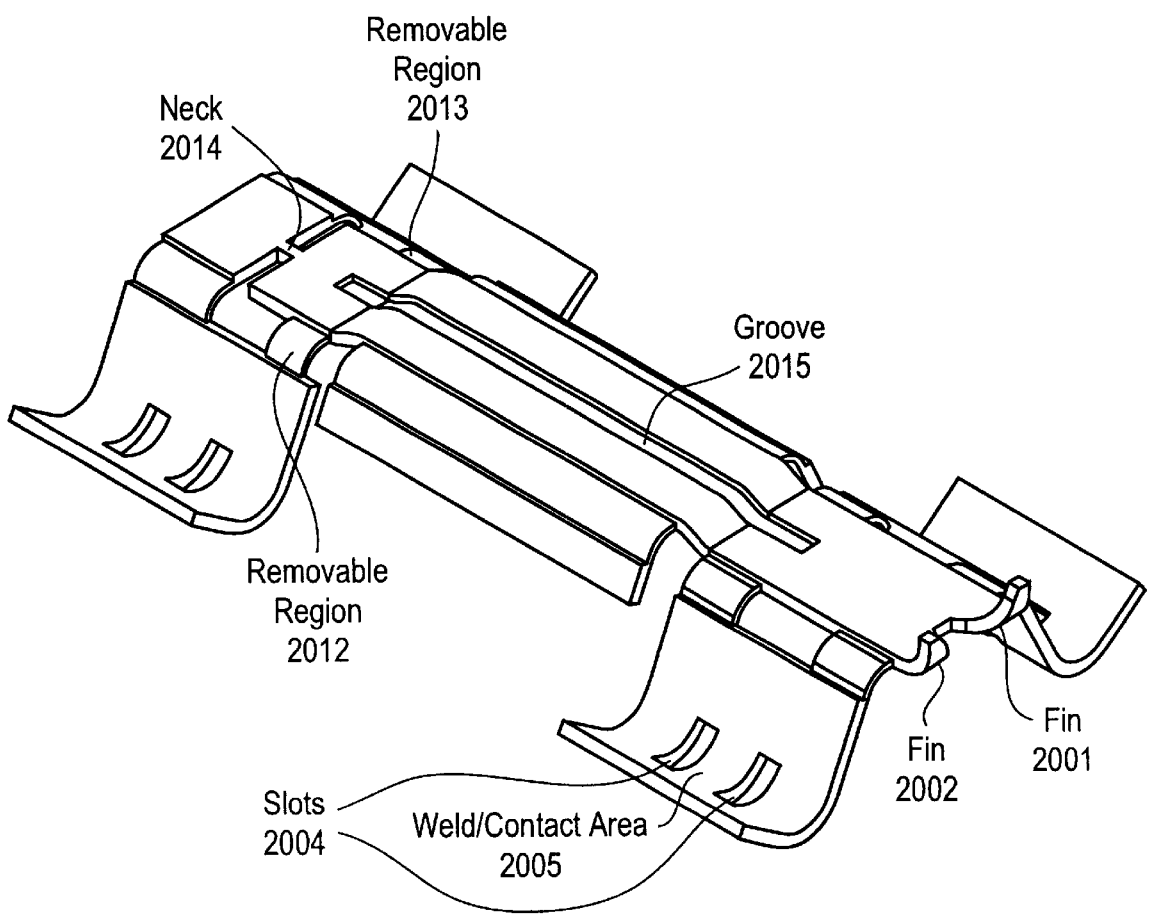
FIG. 17 shows an alternate embodiment of a flexure.
Figure 18:
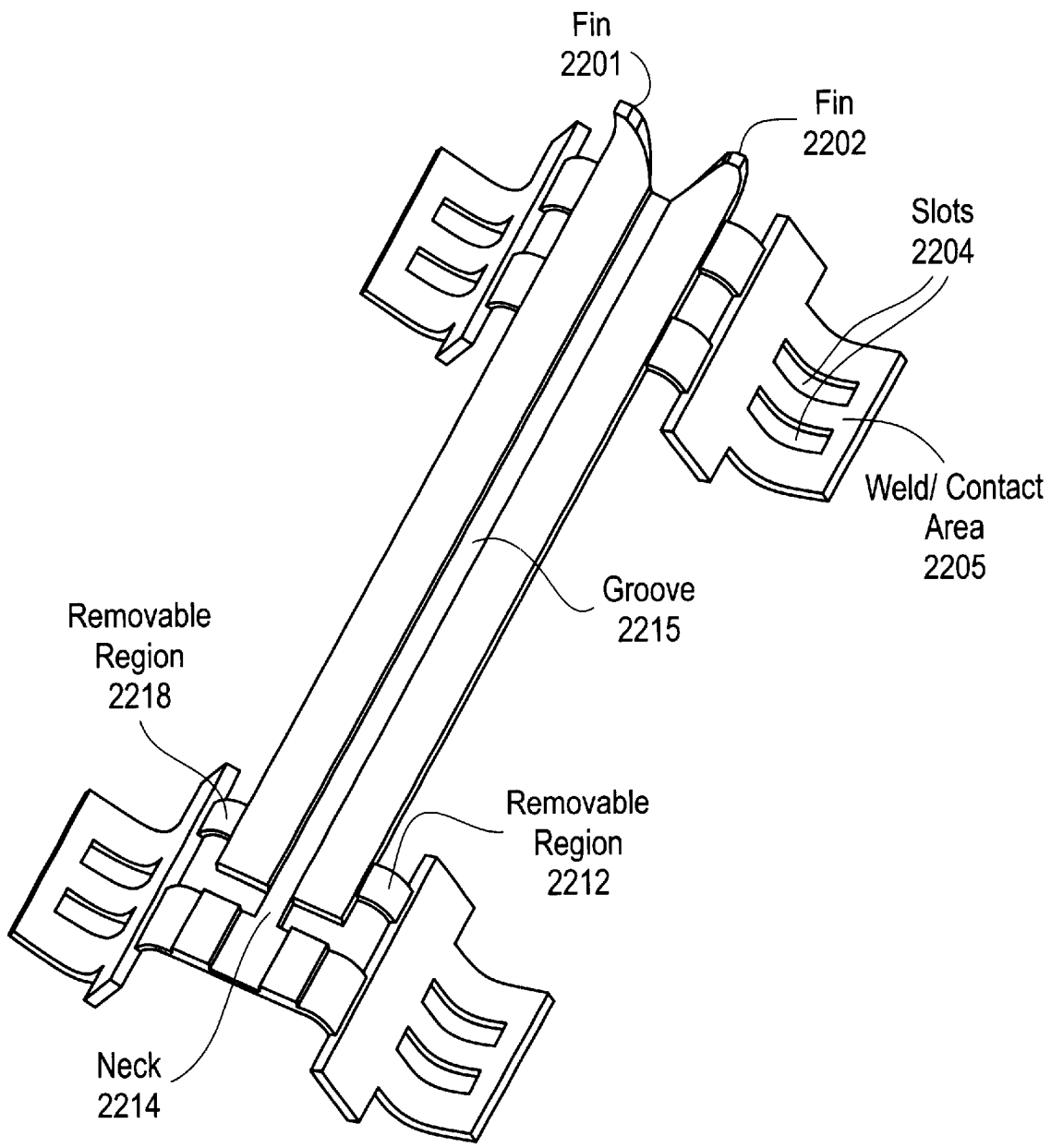
FIG. 18 shows an alternate embodiment of a flexure.
Figure 19:
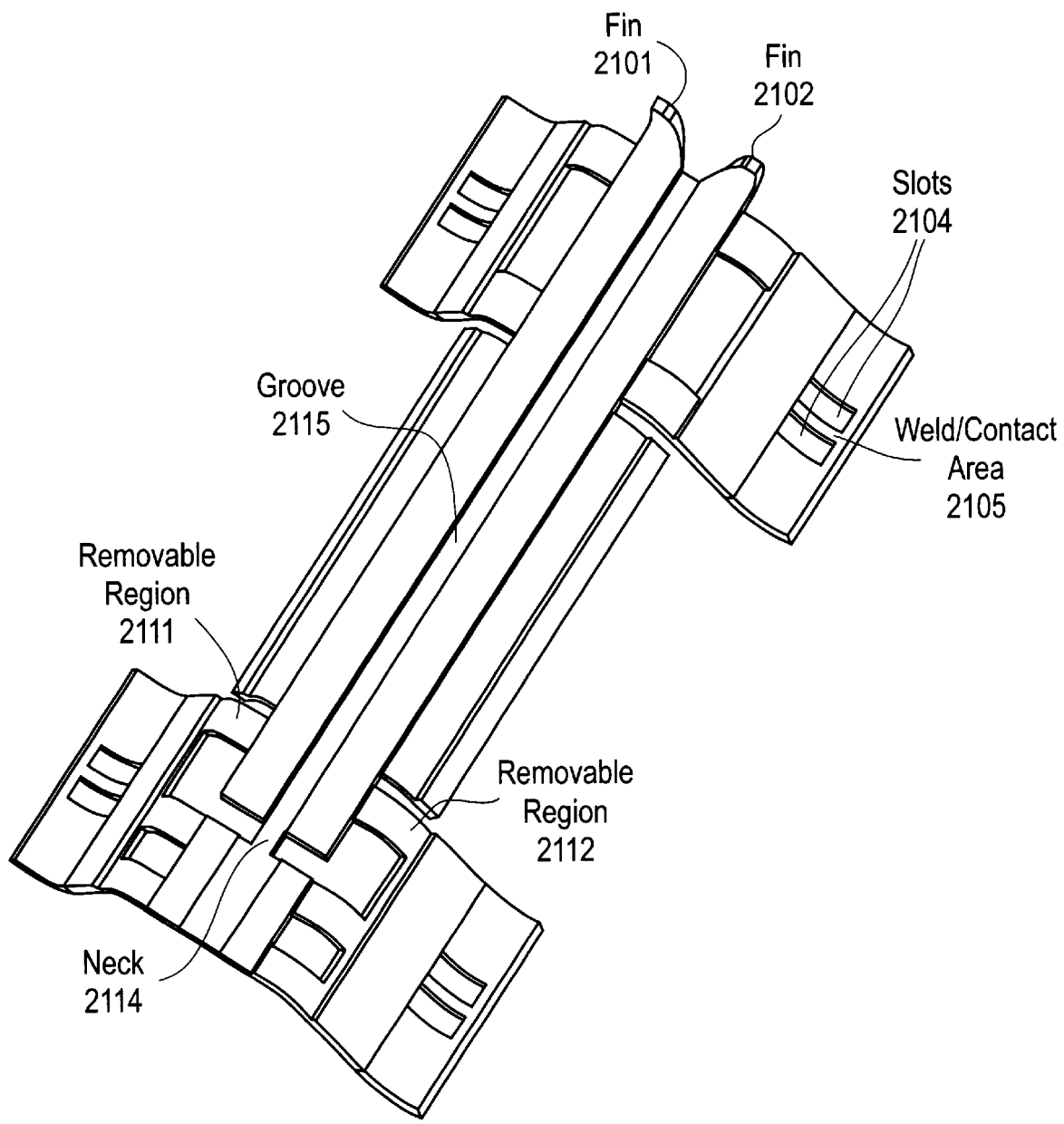
FIG. 19 shows an alternate embodiment of a flexure.

To facilitate the assembly process, in one embodiment, the flexures include a tail area for centering the fiber. FIGS. 16, 17, 18 and 19 illustrate alternative embodiments of the flexure having fins. FIGS. 16 and 18 illustrate such a centering area in the form of fins on either side of a groove that supports a fiber. Referring to FIG. 16, fins 1901 and 1902 are used to center the fiber. Also, the flexure in FIG. 18 has weld strips, or weld/contact areas, 1905 for welding the flexure, as well as rigid regions. Similarly, referring to FIG. 17, fins 2001 and 2002 are used for centering the fiber.

The mechanical system described herein may be used for aligning other precision parts having a similar alignment tolerances, such as magnetic recording heads, MEMs, and medical equipment, etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method for manufacturing and aligning an optical package comprising:

positioning a flexure having an attached second optical component with respect to a substrate having a positioning floor with a first optical component attached thereto, said flexure having at least two legs;

applying pressure on top of the flexure using a removable positioning tool until the optical axis of the first and second optical elements are aligned in the vertical plane;

moving the flexure over the substrate using the positioning tool until the optical axis of the first and second optical elements are coarsely aligned in the horizontal plane;

coupling a first plurality of legs at a first end of the flexure to the substrate;

moving the flexure to adjust the optical alignment between the optical fiber and the first optical element; and coupling a second plurality of legs at a second end of the flexure to the substrate, wherein coupling at least one of the first or second plurality of legs comprises spot welding the at least one plurality of legs to the substrate at an aperture in each leg.

2. The process defined in claim 1 wherein coupling the first and second plurality of legs to the substrate comprises spot welding the first and second plurality of legs to the substrate.

3. The process defined in claim 1 wherein the aperture comprises a slot.

4. The process defined in claim 1 wherein coupling at least one of the first or second plurality of legs comprises spot welding the at least one plurality of legs to the substrate between a pair of apertures in each leg.

5. The process defined in claims 4 wherein the pair of apertures comprises a pair of slots and spot welding occurs at a strip between the pair of slots.

6. The method defined in claim 1 wherein the vertical plane is perpendicular to the substrate plane and the horizontal plane is parallel to the substrate plane.

7. A process for manufacturing a package comprising:
  applying pressure to a flexure having a plurality of legs with at least one aperture, positioned on a substrate having a first optical element attached thereto so that an optical axis of a second optical element is coarsely aligned optically with the first optical element;
  coupling a first plurality of legs at a first end of the flexure to the substrate;
  moving the flexure to adjust the optical alignment between the second optical element and the first optical element; and
  coupling a second plurality of legs at a second end of the flexure to the substrate, wherein coupling of at least one leg of the first and second plurality of legs to the substrate is at the aperture.

8. The process defined in claim 7 wherein coupling at least one of the first or second plurality of legs comprises welding the at least one plurality of legs to the substrate near the at least one aperture in each leg.

9. The process defined in claim 8 wherein the aperture comprises a slot.

10. The process defined in claim 7 wherein coupling at least one of the first or second plurality of legs comprises welding the at least one plurality of legs to the substrate between a pair of apertures in each leg.

11. The process defined in claim 10 wherein the pair of apertures comprises a pair of slots.

\* \* \* \* \*